United States Patent [19]

McKean et al.

[11] Patent Number: 4,853,315

[45] Date of Patent: Aug. 1, 1989

[54] O-QUINONE DIAZIDE SULFONIC ACID MONOESTERS USEFUL AS SENSITIZERS FOR POSITIVE RESISTS

[75] Inventors: Dennis R. McKean; Robert D. Miller, both of San Jose; Joseph G. Walsh, Oakland; Carlton G. Willson, San Jose, all of Calif.

[73] Assignee: International Business Machines Corporation, Armonk, N.Y.

[21] Appl. No.: 144,825

[22] Filed: Jan. 15, 1988

[51] Int. Cl.$^4$ .............. G03C 1/54; G03C 1/60; C07C 113/00
[52] U.S. Cl. .................. 430/192; 430/193; 430/326; 534/556; 534/557
[58] Field of Search ................ 430/192, 193, 326; 534/557, 556

[56] References Cited

U.S. PATENT DOCUMENTS

| | | | |
|---|---|---|---|
| 2,767,092 | 10/1956 | Schmidt | 430/193 |
| 3,050,389 | 8/1962 | Sus | 430/193 |
| 3,061,430 | 10/1962 | Uhlig et al. | 430/193 |
| 3,640,992 | 2/1972 | Sus et al. | 260/141 |
| 4,397,937 | 8/1983 | Clecak et al. | 430/192 |

FOREIGN PATENT DOCUMENTS 0147596  7/1985  United Kingdom .

*Primary Examiner*—Charles L. Bowers, Jr.
*Attorney, Agent, or Firm*—Peter R. Leal; John A. Stemwedel

[57] ABSTRACT

Esters of 1-oxo-2-diazo-naphthalene sulfonic acid wherein the sulfonic acid group is at either the 4 or the 5 position of a hydroxymethyl-tricyclo [5.2.1.0$^{2,6}$] decane wherein the hydroxy group is either at the 3 or 4 position and useful as sensitizers for positive resists, particularly relatively thick resists at 365 nm.

6 Claims, No Drawings

O-QUINONE DIAZIDE SULFONIC ACID MONOESTERS USEFUL AS SENSITIZERS FOR POSITIVE RESISTS

TECHNICAL FIELD

The present invention is concerned with sulfonic acid esters useful as sensitizers for positive resists. The resists are especially useful with radiation at 365 nm as relatively thick resists where low optical density is necessary.

BACKGROUND ART

U.S. Pat. No. 4,397,937 of Clecak et al shows sensitizers which are esters of 1-oxo-2-diazonaphthalene sulfonic acid and of certain diols including tricyclodecane derivatives. This patent is concerned exclusively with esters of diols and can be said to direct attention away from the present invention, which is concerned only with esters of monohydroxy alcohols. The compounds of the prior art patent, when used at 365 nm, have much higher optical density than the compounds of the present invention at loadings required to achieve high contrast performance. These materials are superior for use at shorter wavelengths (i.e. 313 nm).

European patent application No. 0147596 of Economy et al shows esters of 1-oxo-2-diazonaphthalene sulfonic acid and certain diols. It discloses no monoesters.

U.S. Pat. No. 3,640,992 of Sus et al issued in 1972. It discloses a single compound, namely the p-cumylphenol ester of 1,2-napthaquinone diazide(2)4-sulfonic acid. Prior to the present invention, this compound of Sus has, for 15 years, been the most soluble diazoquinone monoester known. The monoesters of the present invention are more soluble than the Sus compound, and have the added advantage of better absorbance and improved bleaching.

DISCLOSURE OF THE INVENTION

The compounds of the present invention are esters of 1-oxo-2-diazo-naphthalene sulfonic acid wherein the sulfonic acid group is at either the 4 or the 5 position, and of a hydroxymethyl-tricyclo [5.2.1.0$^{2,6}$] decane, wherein the hydroxymethyl group is either at the 3 or 4 position. It is believed that these compounds are novel. They are made by standard procedures from the sulfonyl chloride derivatives of the sulfonic acids and the hydroxymethyl-tricyclic compounds. The starting materials are commercially available.

The resist industry, at present, is tending toward use of light from mercury lamps at the I line (365 nm) to improve resolution. Lenses and other optical equipment are now readily available for use at this wavelength. Currently available sensitizers, however, have deficiencies for use at this wavelength. The sensitizer must simultaneously possess all of several properties. It must be soluble. It must have a low optical density at concentrations consistent with high contrast performance. It must absorb at 365 nm. The sensitizer should also be thermally stable. The esters of the present invention are unique in possessing all of these characteristics.

The tricyclo [5.2.1.0$^{2,6}$] decane skeleton, which is derived from dicyclopentadiene and derivatives, can be hydroxylated or hydroxymethylated at a variety of sites to produce mono and difunctional derivatives. In this discussion we refer specifically to materials prepared from 3(4)-hydroxymethyltricyclo [5.2.1.0$^{2,6}$] decane (structure III) which is commercially available as an epimeric and isomeric mixture. In this regard, the mixture is often a preferred starting material because the sulfonate esters derived from reaction with 4 or 5-chlorosulfonyl-1-oxo-2-diazonaphthalene (structures I and II) are solid but noncrystalline materials which are very soluble in many resin-solvent mixtures commonly employed in resists. In addition, use of I and II, which have significantly different optical absorption spectra and which are compatible with each other and are soluble in mixture with said resins, allows the adjustment of the optical density at will over a very wide spectral range (300-450 nm) and thus provides previously unobtainable formulation flexibility.

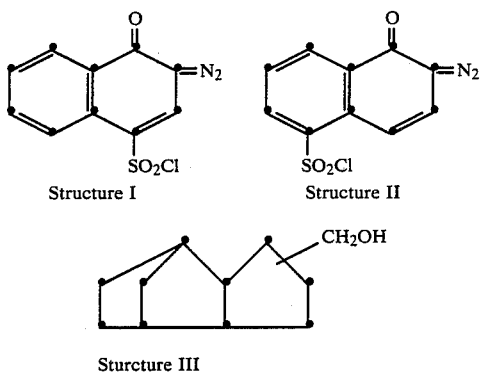

Structure I     Structure II

Sturcture III

The novel esters of the present invention are particularly useful as sensitizers for positive resists. As such, they are useful with any of the many resins ordinarily used in such resists. Particularly useful are phenolic resins, such as the novolac resins and polymers or copolymers of p-hydroxystyrene.

The following examples are given solely to illustrate preferred embodiments of the present invention, many variations of which will occur to those skilled in the art, without departing from the spirit or scope thereof.

SYNTHESIS

3', (4')-4-sulfonyloxymethyl-1-oxo-2-diazonaphthalene)tricyclo [5.2.1.0$^{2,6}$] decane I: A flask was charged with 0.5g (3.0mmol) of 3(4)-hydroxymethyl tricyclo [5.2.1.0$^{2.6}$]decane, 0.7 mL triethylamine, 38 mg (0.3 mmol) 4-dimethylamino pyridine and 20 mL of methylene chloride. At this point, 1.183g (4.4 mmol) of 4-chlorosulfonyl-1-oxo-2-diazonaphthalene was added in 3 portions over 0.5h at 25 degrees C. At 18h, an additional 0.24 mL of triethylamine and 0.35g of the sulfonyl chloride was added and the stirring continued for 6h. The mixture was diluted with methylene chloride and washed 2X with 10% K$_2$CO$_3$, 6N HCl, sat NaHCO$_3$ and dried over Na$_2$SO$_4$. The crude product was purified by chromatography over silica gel using methylene chloride - 3% acetone as the eluant. In this manner 620mg of pure product I was obtained.

In an analogous fashion, starting with the corresponding 5-chlorosulfonyl compound, 3',(4')-5-sulfonyloxymethyl-1-oxo-2-diazonaphthalene-tricyclo [5.2.1.0$^{2.6}$] decane II was prepared.

I: $^1$H NMR $\delta$(CDCl$_3$) 8.0–8.6 (m,3H), 7.3–7.8 (m,2H), 3.6–4.1 (m,2H) and 0.5–2.5 (m,15H); UV (EtOH), 260 (21,073), 301 (2863), 313 (2500) and 378 (3200).

II: $^1$H NMR δ(CDCl$_3$) 8.1–8.7 (m,2H), 7.0–7.6 (m,3H), 3.55–3.90 (M,2H), 0.4–2.4 (m,15H); UV (EtOH), 227 (25461), 260 (19476), 336 (8690), 399 (7948).

LITHOGRAPHY

A resist formulation was prepared by dissolution of 0.2g of sensitizer I and 1.0g of Varcum resin (Varcum is a trademark of Reichhold Chemical Co. for its cresol-formaldehyde resin) in 2.8g of diglyme. The solution was filtered and then spin-coated on silicon wafers to a thickness of approximately one micrometer. The films were baked at 90 degrees C for 5 minutes and then exposed at 365 nm.

The resist photo-bleaching characteristics were examined by exposure of the films to 100 mj/cm$^2$ increments of 365 nm light. The initial absorbance of 365 nm (0.34) was observed to decrease continuously with each irradiation. Finally after three such irradiations (300 mj/cm$^2$ total dose), the absorbance had decreased to less than 0.05.

The resist contrast was measured using various dilutions of a commercially available aqueous alkali solution. The films were irradiated at 365 nm (100 mj/cm$^2$) through a step-wedge mask which exposes different regions of the wafer to various light intensities. The films were then immersed in the developer solution until the complete dissolution of the region receiving maximum light intensity was observed. The film thicknesses of all of the regions were then measured, normalized to one micrometer of films development. Contrast values were obtained by measuring the slopes of thee plots. The contrast was observed to increase with decreasing developer strength and contrast values greater than 2 could be obtained with sufficiently dilute base with development times of less than 3 minutes.

Photoresist images were obtained using the conditions described. Little if any film loss was observed in the unexposed regions and the images for a variety of different features were of good quality.

The high solubility and compatibility of these sensitizers in the casting solvent and in the films permitted the use of a number of other useful formulations. A wide range of optical densities could be achieved by using various formulations for film preparation which were also capable of inhibiting film dissolution in the unexposed region. The advantages of low optical density resists for the patterning of thick films has already been demonstrated.

Unique resist characteristics can be achieved by blending sensitizers of type I and II with Varcum resin. The films obtained from such formulations possessed virtually continuous bleachable absorption from 300 nm to beyond 440 nm, which permits the use of a very wide band of radiation for photo-imaging. X-ray and e-beam irradiation were also useful for the imaging process. The resists of the present invention are particularly useful with radiation at 365 nm as relatively thick resists where low optical density is required.

We claim:

1. A radiation sensitive monoester of
   an acid selected from the group consisting of 1-oxo-2-diazonaphthalene-4-sulfonic acid and 1-oxo-2-diazonaphthalene-5-sulfonic acid and of an alcohol selected from the group consisting of 3-hydroxymethyl tricyclo decane and 4-hydroxymethyl tricyclo decane.

2. A positive resist composition comprising a resin in an amount sufficient to form a film and in an amount sufficient to sensitize it to radiation, a monoester as claimed in claim 1.

3. A composition as claimed in claim 2 wherein the resin is a phenolic resin.

4. A composition as claimed in claim 3 wherein the phenolic resin is a novolac resin.

5. A composition as claimed in claim 3 wherein the phenolic resin is a polymer or copolymer of p-hydroxystyrene.

6. A composition as claimed in claim 2 wherein the sensitizer comprises at least two monoesters.

* * * * *